(12) United States Patent
Sakaida

(10) Patent No.: US 6,936,532 B2
(45) Date of Patent: Aug. 30, 2005

(54) SUBSTRATE HAVING A PLURALITY OF BUMPS, METHOD OF FORMING THE SAME, AND METHOD OF BONDING SUBSTRATE TO ANOTHER

(75) Inventor: Atusi Sakaida, Nagoya (JP)

(73) Assignee: Denso Corporation, Kariya (JP)

( * ) Notice: Subject to any disclaimer, the term of this patent is extended or adjusted under 35 U.S.C. 154(b) by 4 days.

(21) Appl. No.: 10/430,257

(22) Filed: May 7, 2003

(65) Prior Publication Data
US 2003/0222343 A1 Dec. 4, 2003

(30) Foreign Application Priority Data
Jun. 3, 2002 (JP) ........................................ 2002-161735

(51) Int. Cl.⁷ .............................................. H01L 21/44
(52) U.S. Cl. ...................... 438/616; 438/612; 438/613; 438/615
(58) Field of Search ................................ 438/612, 613, 438/615, 616

(56) References Cited

U.S. PATENT DOCUMENTS

| | | | |
|---|---|---|---|
| 5,341,564 A | * | 8/1994 | Akhavain et al. .............. 29/832 |
| 5,775,569 A | | 7/1998 | Berger et al. |
| 6,165,885 A | * | 12/2000 | Gaynes et al. .............. 438/612 |
| 6,189,771 B1 | * | 2/2001 | Maeda et al. ............. 228/248.1 |
| 6,319,810 B1 | | 11/2001 | Ochiai et al. |
| 6,372,549 B2 | * | 4/2002 | Urushima .................... 438/118 |
| 6,429,114 B1 | * | 8/2002 | Hayama et al. ............. 438/616 |
| 6,432,807 B1 | | 8/2002 | Tsukui et al. |
| 6,664,127 B2 | * | 12/2003 | Oka et al. ..................... 438/64 |
| 2002/0173135 A1 | | 11/2002 | Tsukui et al. |
| 2002/0173136 A1 | | 11/2002 | Tsukui et al. |
| 2002/0177295 A1 | | 11/2002 | Tsukui et al. |

FOREIGN PATENT DOCUMENTS

| | | |
|---|---|---|
| JP | A-09-116257 | 5/1997 |
| JP | A-H10-209204 | 8/1998 |
| JP | A-2001-135667 | 5/2001 |

* cited by examiner

*Primary Examiner*—Amir Zarabian
*Assistant Examiner*—Christy Novacek
(74) *Attorney, Agent, or Firm*—Posz Law Group, PLC

(57) ABSTRACT

A plurality of bumps is formed on a substrate. At first, a hole having a bottom is formed in a sheet, and the hole is filled with a metallic paste. Then, the sheet is stacked and positioned on the substrate so that the hole of the sheet faces an electrode of the substrate. The substrate with the sheet is heated and pressurized so that the metallic paste is sintered and bonded to the electrode so as to form the bump. Then, the sheet is separated from the substrate having the bump, so that the bump is formed on the substrate. A part of each bump does not lack, and all of the bumps are formed surely. Therefore, the bump can be formed uniformly.

34 Claims, 6 Drawing Sheets

SUBSTRATE HAVING A PLURALITY OF BUMPS, METHOD OF FORMING THE SAME, AND METHOD OF BONDING SUBSTRATE TO ANOTHER

CROSS REFERENCE TO RELATED APPLICATION

This application is based on Japanese Patent Application No. 2002-161735 filed on Jun. 3, 2002, the disclosure of which is incorporated herein by reference.

FIELD OF THE INVENTION

The present invention relates to a substrate having a plurality of bumps, method of forming a plurality of bumps of a substrate, and method of bonding a substrate having a plurality of bumps to another substrate.

BACKGROUND OF THE INVENTION

An electrolytic plating method is well known as a method for forming a bump on an electrode of a semiconductor substrate. This electrolytic plating method according to a related art is described as follows.

As shown in FIG. 7, a semiconductor substrate 11, which is made of silicon wafer, includes a plurality of electrodes 21. A photo-resist mask 70 is formed on the substrate 11, and has an opening for forming a bump 60 on a surface of the electrode 21. The substrate 11 is dipped in plating solution 4.

The electrode 21 of the substrate 11 is used as a cathode electrode dipped in the plating solution 4, and an anode electrode 8 is also dipped in the plating solution 4. Then, a predetermined electric voltage is supplied from a power supply 3 between the anode electrode 8 and the cathode electrode, so that metallic ions dissolved in the plating solution 4 are deposited on the surface of the cathode electrode, i.e., the electrode 21, on which the bump 60 is formed. Thus, the bump 60 is formed by deposition of the metallic ions.

In general, a copper film is deposited on the substrate 11 before the photo-resist mask 70 is formed on the substrate 11. In other words, the copper film is formed on the substrate 11, and the photo-resist mask 70 is formed on the copper film, so that the electrolytic plating is stabilized and the metallic ions are deposited properly. After the bump 60 is formed, unnecessary copper film is eliminated with etching method.

In the above method, for example, a diameter of the opening of the photo-resist mask 70 defines a shape of the bump 60. Moreover, by setting a predetermined thickness of the photo-resist mask 70, a height of the bump 60 can be controlled, and by setting a predetermined interval between the openings, an interval between the bumps 60 can be controlled.

Recently, according to densification of electronic circuit formed on a semiconductor chip, both of the electrode 21 and the bump 60 formed on the chip are required to minimize and to narrow each interval therebetween, respectively. Moreover, a high bump 60 is required so as to reduce a distortion arising from the difference of coefficient of thermal expansion between a printed circuit board and the semiconductor chip mounted on the printed circuit board. According to the above aspect, the electrolytic plating method has the following problems.

When the bump 60 is formed by the electrolytic plating method, a part of the bump 60 may lack because gaseous hydrogen produced in the plating solution prevents the bump from depositing. Moreover, some bumps 60 may fail to deposit and to grow by means of the gaseous hydrogen. Therefore, the bump 60 cannot be formed uniformly by the electrolytic plating method.

Further, when a plurality of bumps 60 is formed by the electrolytic plating method, each height of the bumps 60 may vary. Dispersion of the height among the bumps 60 increases in accordance with increasing the height of the bumps 60. Thus, it is difficult to mount the semiconductor chip having the bumps 60 on the printed circuit board because of the dispersion of the height. Especially in a case of high bumps, the chip cannot be mounted on the circuit board properly.

SUMMARY OF THE INVENTION

In view of the above problem, it is an object of the present invention to provide a substrate having a plurality of bumps, which is uniformly formed on the substrate. Moreover, the present invention provides a method of forming a plurality of bumps on a substrate, each of which has a uniform height. Further, it is another object of the present invention to provide a method of bonding a substrate having a plurality of bumps to another substrate.

A plurality of bumps is formed on a substrate by the following manner. At first, a hole having a bottom is formed at a predetermined position in a sheet, the position of the hole corresponding to a position of an electrode of the substrate. The hole is filled with a metallic paste. Then, the sheet is stacked and positioned on the substrate so that the hole of the sheet faces the electrode of the substrate. The substrate with the sheet is heated and pressurized so that the metallic paste is sintered and bonded to the electrode so as to form a bump. Then, the sheet is separated from the substrate having the bump, so that the bump is formed on the substrate. Each bump does not lack, and all of the bumps do not fail to form. Therefore, the bump can be formed uniformly by the above method.

Preferably, each bump has a tapered shape, a cross-section of which becomes small as it goes from a surface of the substrate to a top of the bump. Here, the cross-section of the tapered shape is parallel to the surface of the substrate. When the substrate is mounted on another substrate, spacing between the substrate and the other substrate can be controlled easily. In other words, the height of the substrate from the surface of the other substrate can be controlled easily, so that the spacing becomes almost uniform, and the substrate aligns to the other substrate easily and accurately.

Next, a first substrate is bonded to a second substrate in the following manner. At first, a bump is formed on an electrode of the first substrate. A hole is formed in the second substrate, wherein the position of the hole corresponds to the position of the electrode of the first substrate, and the hole has a bottom. Then, the hole of the second substrate is filled with a metallic paste, and the first substrate is stacked and positioned on the second substrate so that the hole of the second substrate faces the bump of the first substrate. The second substrate with the first substrate is heated and pressurized so that the metallic paste is sintered and bonded to the electrode. As a result, the first substrate is bonded to the second substrate.

In the above bonding method, the first substrate can be positioned easily and accurately to the second substrate when the first substrate is stacked on the second substrate, because the bump of the first substrate is easily inserted into the hole filled with the metallic paste. Moreover, a bonding portion between the first and second substrates increases, so that the first substrate can be bonded strongly to the second substrate.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENT (First Embodiment)

Figure 1A:
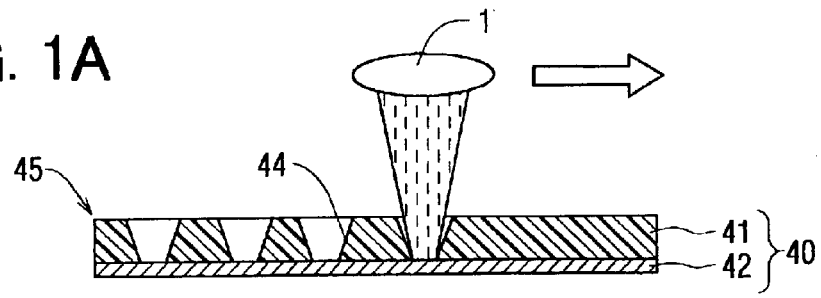
FIGS. 1A–1D are cross-sectional views explaining a process of forming a plurality of bumps on a semiconductor substrate, according to a first embodiment of the present invention.

Referring first to FIG. 1A, a sheet 45 is prepared. The sheet 45 is composed of a bonded film 40, which includes a film 41 and a metallic film 42. The film 41 is bonded to the metallic film 42. Preferably, the film 41 is made of thermoplastic resin, for example, liquid crystal polymer, polyether ether ketone resin, polyether imide resin, and mixture of polyether ether ketone resin and polyether imide resin. These materials have moderate flexibility and heat resistance, so that a bump 61 shown in FIG. 1D can be easily formed.

Figure 1B:
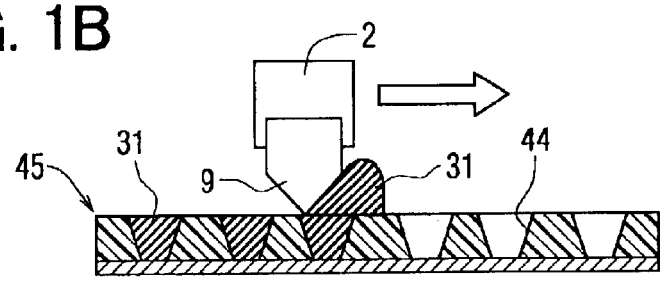
Figure 1C:
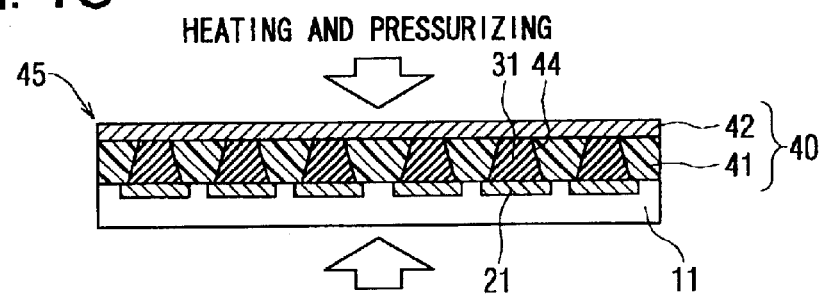
Figure 1D:
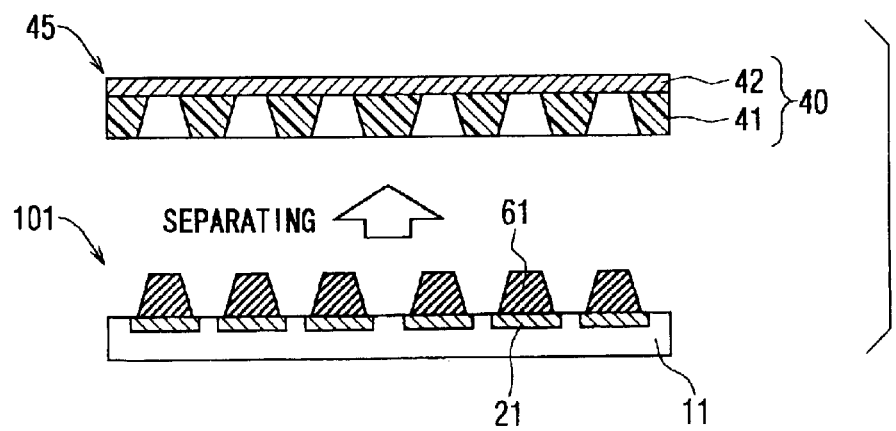

More preferably, the coefficient of linear expansion of the film 41 is almost equal to that of a semiconductor substrate 11 shown in FIG. 1D, because the film 41 is disposed on the substrate 11 and then heated. Therefore, when a difference of the coefficient of linear expansion between the film 41 and the substrate 11 is comparatively large, filler is added in the film 41 so that the difference of the coefficient of the linear expansion reduces. When the substrate 11 with the sheet 45 is heated and pressurized, a crack of the substrate 11 or a shear of the bump 61, which is caused by the difference of coefficient of linear expansion, are prevented.

In the first embodiment, the film 41 is made of liquid crystal polymer, and a thickness of the film 41 is 125 $\mu$m.

Preferably, the metallic film 42 is made of metallic foil, for example, copper foil, aluminum foil, or the like. With using these metals, the hole can be easily formed. In the first embodiment, the metallic film 42 is made of copper foil, and a thickness of the metallic film is 18 $\mu$m.

As shown in FIG. 1A, a laser beam irradiates on the surface of the film 41 in the bonded film 40 with using a carbon dioxide laser beam machine 1. The laser beam drills the film 41 so that a hole 44 is formed.

Physical properties of thermoplastic resin composing the film 41 are much different from those of metallic foil composing the metallic film 42. Therefore, a drilling effect of the laser beam irradiation on the film 41 is also much different from that on the metallic film 42. In other words, a drilling energy of the film 41 is much smaller than that of the metallic film 42. Therefore, it is easy to drill a plurality of holes 44 in the film 41 without drilling the metallic film 42. The hole 44 reaches an interface between the film 41 and the metallic film 42, so that the hole 44 has a bottom of the metallic film 42. Thus, each hole 44 has an equivalent depth, which is equal to the thickness of the film 41. Moreover, the laser beam can form the hole 44 into a various shape, which corresponds to a shape of the bump 61.

Here, the hole 44 is disposed at a predetermined position in the film 41. This predetermined position corresponds to an electrode 21 of the semiconductor substrate 11 shown in FIG. 1C.

In this laser beam processing, the hole 44 can have a tapered shape, as shown in FIG. 1A. The tapered hole 44 has a bottom, an area of which is smaller than an area of opening at the surface of the film 41. In other words, a cross-section of the hole 44, which is parallel to the surface of the film 41, becomes small as it goes toward the bottom of the hole 44. For example, when the thickness of the film 41 is 125 $\mu$m, a diameter of the opening at the surface of the film 41 is in a range of 120–140 $\mu$m, and a diameter of the hole at the bottom is 100 $\mu$m. With using this sheet 45 having the tapered hole 44, it is easy to separate the bonded film 40 from the substrate 11 after forming the bump 61 in a hot-pressing process.

Although the sheet 45 is composed of the bonded film 40, a single film made of thermoplastic resin can be used as the sheet 45, i.e., the sheet is composed of only a thermoplastic resin film. In this case, a laser beam power is reduced so that the laser beam does not drill through the resin film.

Further, another method can be available for forming the hole 44. For example, etching method is used for forming the hole 44.

Next, as shown in FIG. 1B, a metallic paste 31 fills the hole 44 with using a filling machine 2. Specifically, a squeegee 9 of the filling machine 2 moves from left to right with vibrating, as shown in FIG. 1B, so that the metallic paste 31 is squeezed into the hole 44.

Here, the metallic paste 31 is prepared in such a manner that binder resin and/or organic solvent are added in mixture of silver particles and tin particles, and are mixed so as to form a paste. Mixture of gold particles and tin particles or mixture of copper particles and tin particles can be used as the metallic paste 31.

Then, the sheet 45 with the hole 44 filled with the metallic paste 31 is reversed, as shown in FIG. 1C. The sheet 45 and the semiconductor substrate 11 are stacked together so that the electrode 21 on the substrate 11 faces the hole 44 filled with the metallic paste 31. The substrate 11 with the sheet 45 is heated and pressurized so that the metallic paste 31 is sintered and bonded to the electrode 21. Heating and pressurizing are performed as follows.

Figure 2:
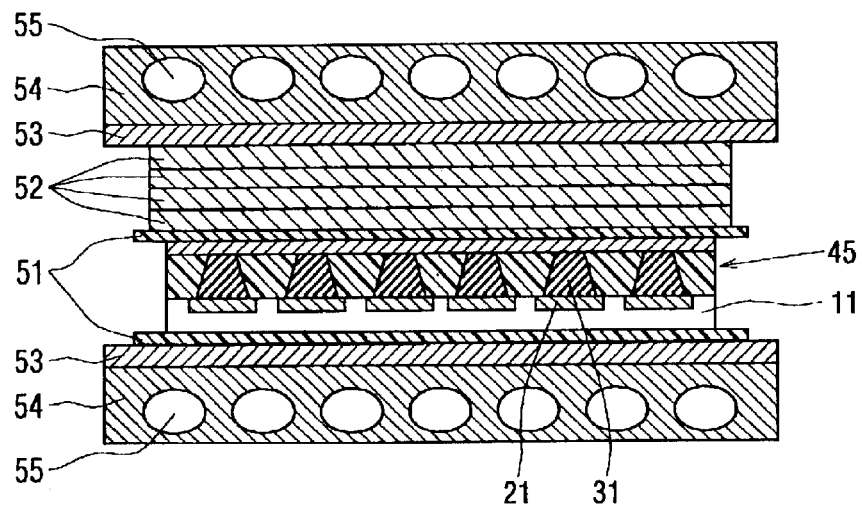
FIG. 2 is a cross-sectional view showing the semiconductor substrate inserted in a hot-press machine, according to the first embodiment.

As shown in FIG. 2, the substrate 11 with the sheet 45 is inserted between a pair of hot-press plates 54 through a pair of adhesive-resistant films 51, a plurality of buffers 52, and a pair of metal plates 53. Each hot-press plate 54 has a heater 55 embedded therein. The adhesive-resistant film 51 prevents the substrate 11 with the sheet 45 from adhering to other parts surrounding the substrate 11, and protects the substrate 11 from damage. The adhesive-resistant film 51 is made of poly-imide film or the like.

The buffer 52 is used for pressurizing the substrate 11 with the sheet 45 uniformly. The buffer 52, for example, is made of metallic fiber with using the following method. Metal such as stainless steel is cut into fibers. The fibrous stainless steel is formed into a plate shape, so that the buffer 52 is formed. In this embodiment, four buffers 52 are inserted between the adhesive-resistant film 51 and the metal plate 53, which are disposed upper side of the substrate 11. Each buffer 52 has a thickness of about 1 mm.

The metal plate 53 protects the hot-press plate 54 from damage. The metal plate 53 is made of stainless steel (i.e., SUS), titanium or the like, and has a thickness of about 2 mm.

The heater 55 heats the substrate 11 up to 200° C. during 5 minutes without pressurizing. Next, a press machine (not shown) pressurizes the substrate 11 at 1–10 MPa through a pair of hot-press plates 55. Preferably, the substrate 11 is pressurized at 6 MPa and more. Then, the substrate 11 is heated at 200–270° C. during 10–30 minutes with being pressurized. Preferably, the substrate 11 is heated at 225° C. during 15 minutes. Heating and pressurizing can be performed in air. However, it is preferred that the heating and pressurizing is performed in vacuum so that the metallic paste 31 and the electrode 21 are protected from oxidation.

In the above process, the metallic paste 31 is sintered and diffused into the electrode 21 mutually, so that a bump 61 is formed.

After that, the sheet 45 is removed from the substrate 11 having the bump 61. Because the sheet 45 is composed of the film 41 made of thermoplastic resin and the metallic film 42 made of extremely thin metallic foil, the sheet 45 maintains flexibility in spite of thermal hysteresis of the sheet 45. Therefore, the sheet 45 can be removed easily.

Here, the metallic paste 31 is bonded strongly to the electrode 21 of the substrate 11, because the metallic paste 31 is mutually diffused in the electrode 21. On the other hand, the metallic paste 31 is not bonded to the metallic film 42 of the sheet 45, because carbon, which is formed at an interface between the metallic film 42 and the metallic paste 31 in the preceding laser beam machining, remains at the interface and works as an adhesive-resistant material that prevents from adhering. The sheet 45 can be also removed from the bump 61 easily. Besides, in a case where the hole 44 is formed by other methods than the laser beam machining, an inner wall of the hole 44 is coated with an adhesive-resistant material before filling the metallic paste 31 so that the sheet 45 can be removed easily after heating and pressurizing.

As a result, a semiconductor wafer 101 having the bump 61 on the electrode 21 is accomplished.

In the first embodiment, each bump 61 has almost the same height, because the height of the bump 61 is equal to the depth of the hole 44. Moreover, the bump 61 has a tapered shape, because the shape of the tapered hole 44 is transferred reversely to the bump 61. The cross-section of the tapered hole 44 becomes small as it goes toward the bottom of the hole 44. Therefore, a cross-section of the bump 61, which is parallel to the surface of the substrate 11, becomes small as it goes toward a top of the bump 61. Thus, the bump 61 is formed into a truncated cone. However, other shapes of the bump 61 can be formed with using the laser beam machining. For example, the hole 44 is formed into a predetermined shape, such as a truncated pyramid, so that the predetermined shape of the hole 44 is transferred reversely to the bump 61. Then, the bump 61 is also formed into the predetermined shape.

The bump 61 is formed by the above method, which is much different from the electrolytic plating method according to the related art. Although, in the electrolytic plating method, a manufacturing time for forming the bump 61 increases in accordance with increasing the height of the bump 61, the manufacturing time of the above method is almost fixed even in a case where the bump 61 becomes high. Therefore, a manufacturing cost is also almost fixed even in a case where the bump 61 becomes high.

Since the depth of the hole 44 defines the height of the bump 61, dispersion of the height of the bump 61 on the substrate 11 can be reduced by means of reducing a dispersion of the depth of the hole 44 and filling the metallic paste 31 into the hole 44 uniformly and sufficiently. Further, the bump 61 is not deformed and each shape of the bumps 61 is almost the same, because the bump 61 is formed of sintered metal.

Further, each bump 61 does not lack, and all of the bumps 61 are formed without fail. Therefore, the bump 61 can be formed uniformly by the above method, in comparison with the electrolytic plating method.

Figure 3A:
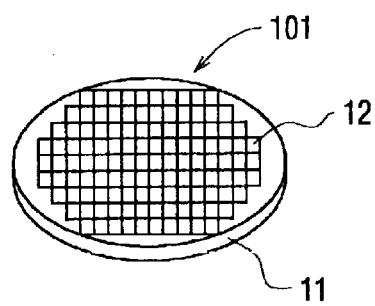
FIG. 3A is a perspective view showing a semiconductor wafer having a plurality of bumps.
Figure 3B:
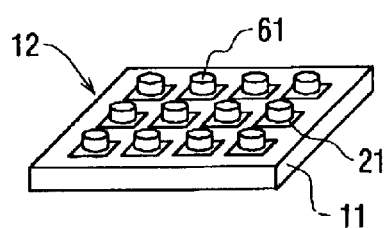
FIG. 3B is a perspective view showing a semiconductor chip.

After the semiconductor wafer 101 having the bump 61 is accomplished, the wafer 101 is cut into predetermined pieces so that a plurality of semiconductor chips 12 is formed, as shown in FIGS. 3A and 3B. Here, one sheet of the wafer 101, in general, has a number of electronic circuit patterns, each of which has the same pattern. For example, the number of the patterns is about hundreds or a thousand. Each chip 12 includes at least one electronic circuit pattern, and has a number of electrodes 21. In general, the number of the electrodes 21 is about dozens or thousands. The number of the bumps 61 is also equal to and more than that of the electrodes 21, because each electrode 21 has at least one bump 61.

In this way, a large amount of chips 12 can be manufactured from only one wafer 101.

Figure 3C:
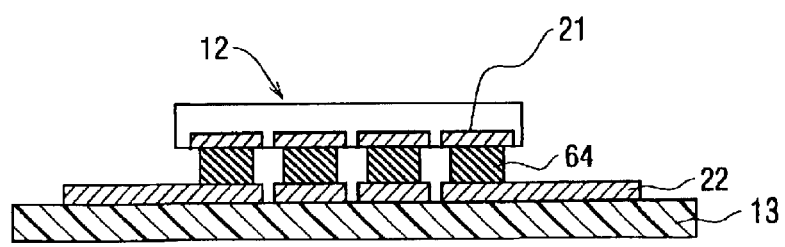
FIG. 3C is a cross-sectional view showing the semiconductor chip mounted on a printed circuit board, according to the first embodiment.

As shown in FIG. 3C, the chip 12 is mounted on a single layer printed circuit board 13. The bump 61 on the chip 12 is positioned to an electrode 22 on the circuit board 13 so as to face each other. Then, the chip 12 is stacked to the circuit board 13, and heated so that the bump 61 is melted. After that, the circuit board 13 with the chip 12 is cooled so that the melted bump 61 is solidified and formed into a connection portion 64. Thus, the chip 12 bonds to the circuit board 13 with the connection portion 64.

The first embodiment can be modified and changed as follows.

Preferably, a protection film is formed on the film 41 before laser beam machining shown in FIG. 1A. The protection film, for example, is made of polyethyleneterephthlate. In this case, the laser beam irradiates on the protection film on the film 41, so that the hole 44 is formed through the protection film. Thus, both the protection film and the film 41 are drilled. After the metallic paste 31 fills the hole 44, the protection film is removed from the film 41. Therefore, the surface of the film 41 becomes clean. Moreover, after the protection film is removed, the metallic paste 31 protrudes from the surface of the film 41 by the thickness of the protection film. The metallic paste 31 and the electrode 21 are bonded easily and strongly in the hot-pressing process because of the following reason.

The metallic paste 31 includes resin and organic solvent. These components are vaporized in the hot-pressing process. Therefore, volume of the metallic paste 31 reduces in the hot-pressing process. To bond the bump 61 formed by the metallic paste 31 to the electrode 21 of the substrate 11 strongly, the metallic paste 31 needs to press-contact the electrode 21 so that both the metallic paste and the electrode 21 are diffused mutually when the metallic paste is melted in the hot-pressing process. In a case where the metallic paste 31 protrudes from the surface of the film 41, the protruded metallic paste 31 compensates the volume reduction of the metallic paste 31 in the hot-pressing process. Thus, the metallic paste 31 press-contacts the electrode 21 sufficiently, so that the bump 61 can bond to the electrode 21 easily and strongly.

Besides, the hole 44 is formed in the film 41, which is made of thermoplastic resin. In the hot-pressing process, the film 41 deforms in a compression direction, i.e., in a vertical direction shown in FIG. 2, so that the hole 44 becomes small and the metallic paste 31 also press-contacts the electrode 21 sufficiently.

(Second Embodiment)

A method for forming a bump, according to a second embodiment of the present invention, is applied to a printed circuit board, as shown in FIGS. 4A to 4D. First, a bump 61 is formed on a triple layer printed circuit board 14, which is made of thermoplastic resin. Here, another multi-layer printed circuit board or a single layer printed circuit board can be used as the circuit board 14. The circuit board 14 includes an electrode 23. Considering a position of the electrode 23 on the circuit board 14, a hole 44 is formed at a certain position in a sheet 47.

The sheet 47 is composed of a bonded film 46, which includes a film 41, a metallic film 42, and a separation film 43. The separation film 43 is formed on the film 41, and the film 41 is formed on the metallic film 42. Here, the thickness of the separation film 43 is 50 µm. The film 41 is made of thermoplastic resin, and the separation film 43 is made of poly-imide resin. Preferably, the film 41 is made of the same resin as thermoplastic resin composing the circuit board 14 so that the coefficient of linear expansion of the sheet 47 is almost equal to that of the circuit board 14. The poly-imide resin composing the separation film 43 is adhesive-resistant to thermoplastic resin, which is used as an insulating material of the circuit board 14. Therefore, the sheet 46 can be removed easily from the circuit board 14 after heating and pressurizing.

The separation film 43 is adhesive-resistant to the circuit board 14, so that the sheet 47 is removed from the circuit board 14 easily after hot-pressing process. Further, the separation film 43 is stacked on the film 41 with using hot-press, after a lower surface of the separation film 43 is roughly finished. The lower surface of the separation film 43 is stuck to the film 41, and the separation film 43 is adhesive-resistant to the film 41, which is made of thermoplastic resin, because of rough finishing.

The hole 44 is formed into a predetermined shape with using a laser beam machine. A laser beam irradiates on an upper surface of the separation film 43 in the bonded film 46, so that the hole 44 reaches the surface of the metallic film 42. Thus, the hole 44 is formed in both the film 41 and the separation film 43, and has a bottom of a metallic film 42.

Figure 4A:
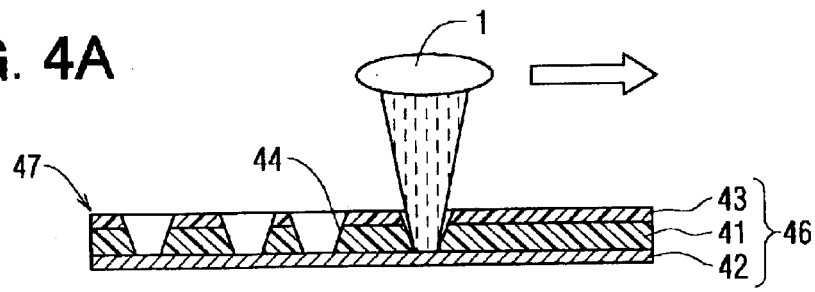
FIGS. 4A to 4D are cross-sectional views explaining a process of forming a plurality of bumps on a printed circuit board, according to a second embodiment of the present invention.
Figure 4B:
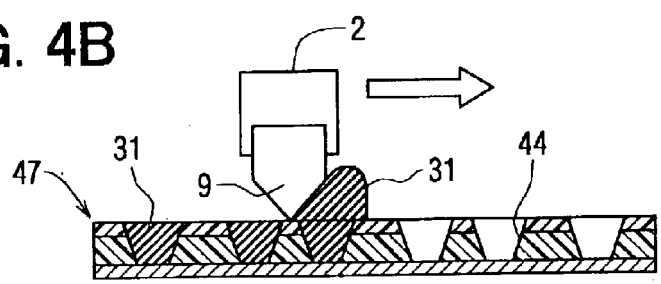
Figure 4C:
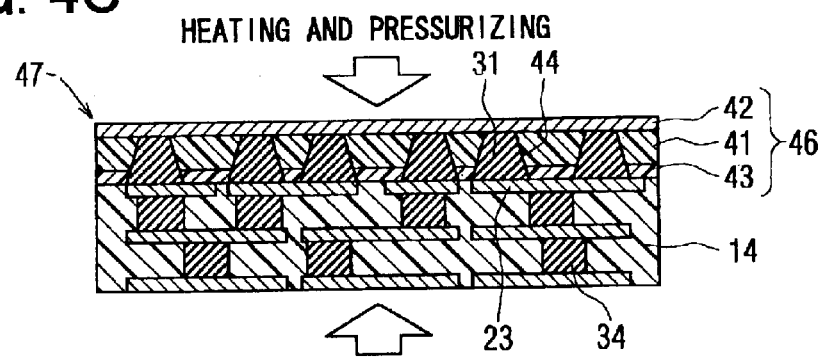
Figure 4D:
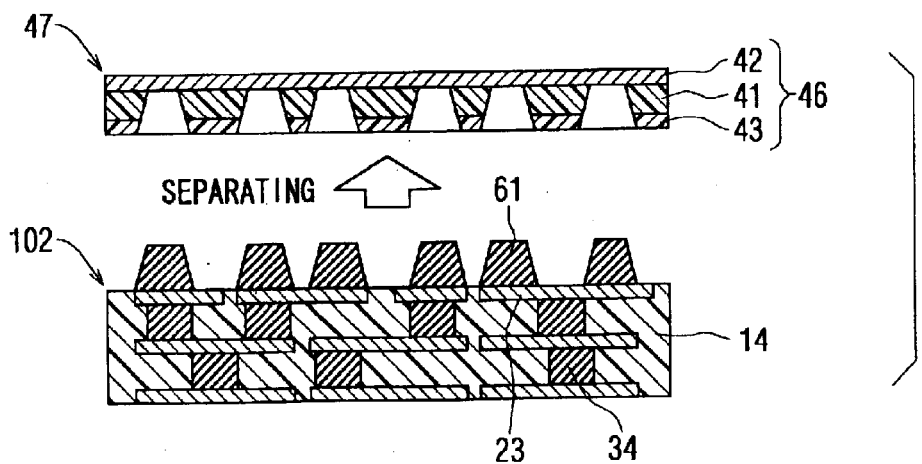

Next, a metallic paste 31 fills the hole 44, as shown in FIG. 4B. Then, the sheet 47 with the metallic paste 31 is reversed, and is stacked on the circuit board 14 so that the hole 44 filled with the metallic paste 31 faces the electrode 23 of the circuit board 14, as shown in FIG. 4C. Here, the circuit board 14 includes an interlayer bonding conductor 34 for connecting electrically between layers of the circuit board 14.

Then, the circuit board 14 with the sheet 47 is heated and pressurized by hot-pressing method shown in FIG. 2. The metallic paste 31 is sintered and mutually diffused into the electrode 23 of the circuit board 14, so that the bump 61 is formed. When the circuit board 14 is heated and pressurized in the hot-pressing process, the circuit board 14 is softened. However, the sheet 47 can be removed easily from the circuit board 14, because the sheet 47 includes the adhesive-resistant film 43, which is adhesive-resistant to the circuit board 14. Accordingly, the sheet 47 with the adhesive-resistant film 43 is removed from the circuit board 14 with the bump 61, so that a triple layer printed circuit board 102 having the bump 61 is formed.

Besides, the triple layer printed circuit board 102 can be stacked on another printed circuit board, so that multi-layer printed circuit board, which has more than three layers, is formed.

(Third Embodiment)

A bonding method for bonding a substrate having a bump to another substrate, according to a third embodiment of the present invention, is described with reference to FIGS. 5A to 5D.

At first, a semiconductor chip 12 having a bump 61 and a double layer printed circuit board 15 are prepared. The circuit board 15 has a plurality of holes 16 formed by the laser beam machine 1, and the hole 16 of the circuit board 15 corresponds to the bump 61 of the chip 12. The hole 16 has a bottom of an inner layer printed circuit 24. The hole 16 is filled with a metallic paste 32 with using a filling machine 2.

Figure 5A:
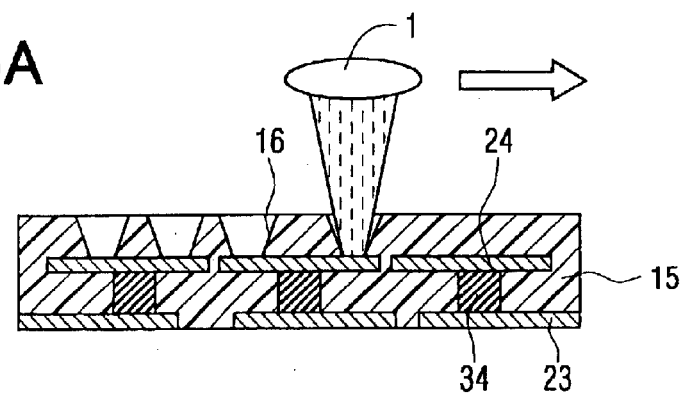
FIGS. 5A and 5D are cross-sectional views explaining a process of bonding a semiconductor chip to a printed circuit board, according to a third embodiment of the present invention.
Figure 5B:
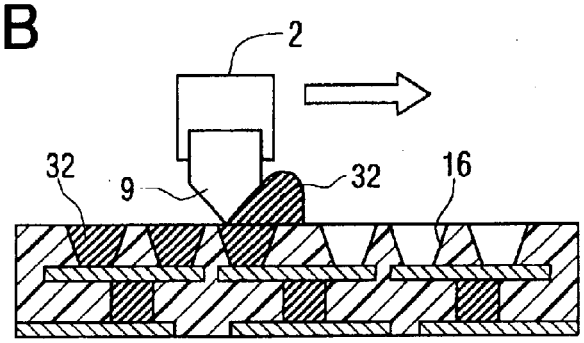
Figure 5C:
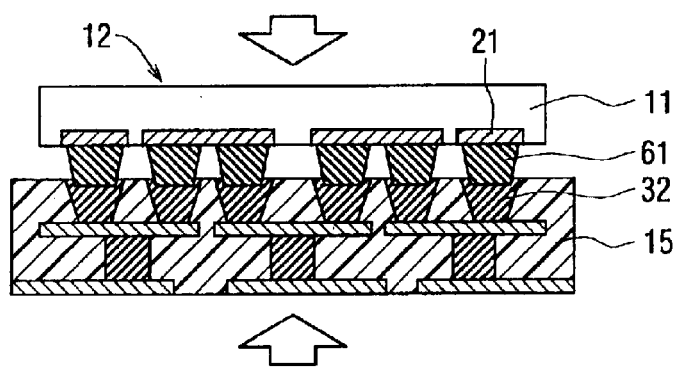
Figure 5D:
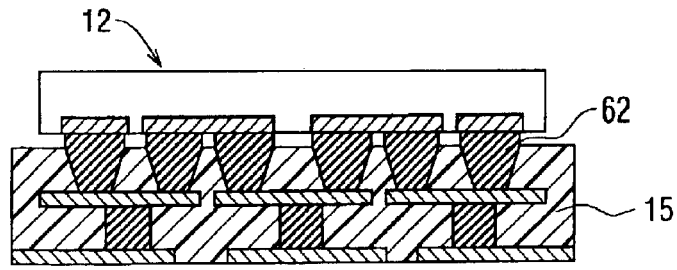

Next, as shown in FIG. 5C, the chip 12 having the bump 61 is reversed, and is stacked on the circuit board 15 so that the bump 61 of the chip 12 faces the hole 16 filled with the metallic paste 32. Then, the circuit board 15 with the chip 12 is heated and pressurized with using a hot-press machine (not shown).

Thus, the metallic paste 32 is sintered and mutually diffused into the bump 61, so that a connection portion 62 is formed, and the chip 12 is connected to the circuit board 15 strongly. Preferably, the metallic paste 32 is composed of the same metallic material as the bump 61, so that the metallic paste 32 can be sintered and mutually diffused easily to the bump 61 and the chip 12 can be bonded to the circuit board 15 strongly.

Moreover, the chip 12 can be positioned easily and accurately to the circuit board 15 when the chip is stacked on the circuit board 15, because the bump 61 of the chip 12 is easily inserted into the hole 16 filled with the metallic paste 32.

Further, the hole 16 of the circuit board 15 has a tapered shape, and the bump 61 of the chip 12 also has a tapered shape. Therefore, when a bottom surface of the hole 16 is set, for example, to be smaller than a top surface of the bump 61, spacing between the chip 12 and the circuit board 15 can be controlled easily after connecting the chip 12 to the circuit board 15. In other words, a height of the chip from a surface of the circuit board 15 can be controlled easily. Therefore, the spacing becomes almost uniform, and the chip 12 aligns to the circuit board 15 easily and accurately.

Further, the bump 61 of the chip 12 is inserted into the hole 16 filled with the metallic paste 32, and then the bump 61 is sintered. Therefore, a bonding portion between the chip 12 and the circuit board 15 increases, and the chip 12 can be bonded strongly to the circuit board 15. Moreover, both the bump 61 and the metallic paste 32 are mutually diffused and bonded, so that the bonding between the chip 12 and the circuit board 15 also becomes strong.

This bonding method can be applied to a method for forming a chip size package device (i.e., the CSP device). Here, the circuit board 15 is used as a re-printed circuit board (i.e. an interposer) in the CSP device.

(Fourth Embodiment)

According to a fourth embodiment, two semiconductor substrates, each of which has a bump, are bonded, as shown in FIGS. 6A to 6D.

At first, a first wafer 101 having a bump 61 and a second wafer 17 having a bump 63 are prepared. The second wafer 17 includes a plurality of holes 18, which corresponds to the bump 61 of the first wafer 101.

Figure 6A:
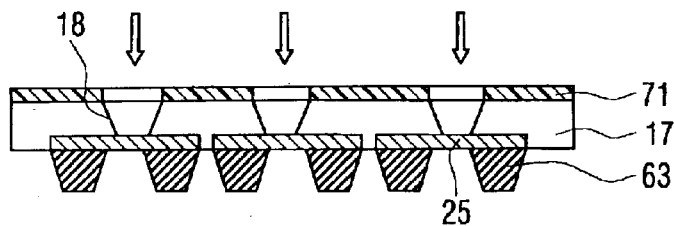
FIGS. 6A and 6D are cross-sectional views explaining a process of bonding two semiconductor wafers, according to a fourth embodiment of the present invention.

As shown in FIG. 6A, the second wafer 17 has the bump 63 on an electrode 25. The hole 18 of the second wafer 17 reaches the electrode 25, so that the hole 18 has a bottom of the electrode 25. The hole 18 is formed as follows. An upper surface of the wafer 17, which is opposite to the bump 63, is covered with a photo-resist mask 71. Then, the photo-resist mask is patterned to a predetermined pattern, which has a plurality of openings. The opening corresponds to the hole 18. The hole 18 is formed by dry-etching method or wet-etching method. In case of wet-etching method, all surface of the wafer 17 is covered with the photo-resist except for the openings. Besides, the hole 18 can be formed into a tapered shape with using a certain etchant.

Figure 6B:
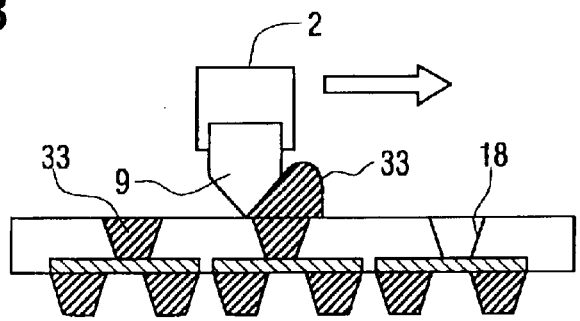
Figure 6C:
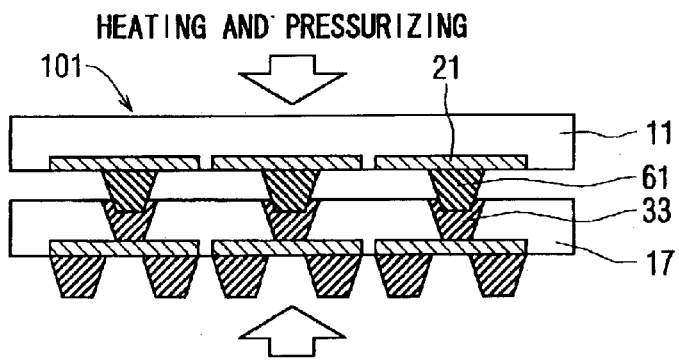
Figure 6D:
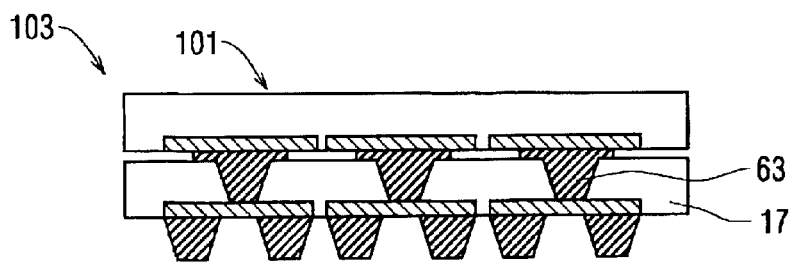
Figure 7:
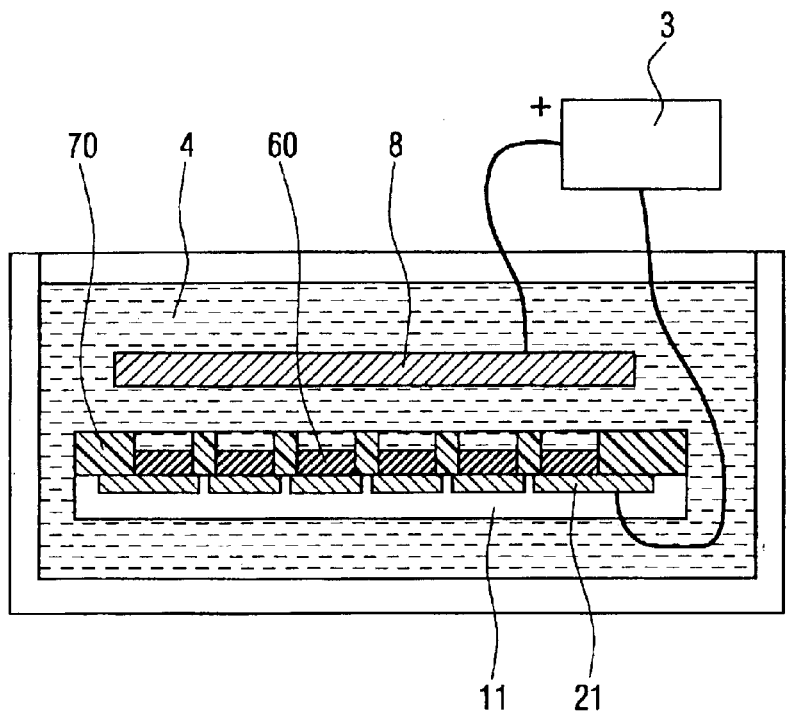
FIG. 7 is a schematic cross-sectional view explaining a process of forming a plurality of bumps on a semiconductor substrate, according to a related art.

The hole 18 is filled with a metallic paste 33, as shown in FIG. 6B. The first wafer 101 is reversed and stacked on the second wafer 17, as shown in FIG. 6C. Then, the second wafer 17 with the first wafer 101 is heated and pressurized, so that the metallic paste 33 is sintered and mutually diffused to the bump 61. Thus, the first wafer 101 is bonded to the second wafer 17, and a double layer semiconductor wafer 103 is formed.

After that, the wafer 103 is cut into semiconductor chips, each of which has a three dimensional circuit.

Although the second wafer 17 has the bump 63, the bump 63 is unnecessary. Here, the bump 63 is used for bonding to another substrate. Further, the bump 63 can be formed after the double layer semiconductor wafer 103 is accomplished.

Although the first wafer 101 is bonded to the second wafer 17, two printed circuit boards can be bonded by the same method so that multi-layer printed circuit board is formed. Moreover, three wafers can be bonded so that multi-layer wafer, which has more than two layers, is formed.

Although the present invention has been fully described in connection with the preferred embodiments and modifications thereof with reference to the accompanying drawings, it is to be noted that further changes and modifications will become apparent to those skilled in the art.

What is claimed is:

1. A method of forming a bump on a substrate, comprising the steps of:
    forming a hole in a sheet at a position corresponding to a position of an electrode of the substrate, the hole having a bottom;
    filling the hole with a metallic paste;
    stacking and positioning the sheet on the substrate so that the hole of he sheet faces the electrode of the substrate;
    heating and pressurizing the substrate with the sheet so that the metallic paste is sintered and bonded to the electrode so as to form a bump; and
    separating the sheet from the substrate having the bump after the step of heating and pressurizing,
        wherein the sheet includes a resin film made of thermoplastic resin and a metallic film made of metallic foil, and
        wherein the hole is formed in the resin film, and reaches a surface of the metallic film so that the bottom of the hole includes the metallic film.

2. The method according to claim 1,
    wherein the resin film is made of liquid crystal polymer, polyether ether ketone resin, polyether imide resin, or mixture of polyether ether ketone resin and polyether imide resin.

3. The method according to claim 1,
    wherein the resin film includes a filler so that a coefficient of linear expansion of the resin film is equal to that of the substrate.

4. The method according to claim 1,
    wherein the metallic film is made of copper or aluminum.

5. The method according to claim 1,
    wherein the hole has a tapered shape, a cross-section of which becomes smaller as it goes from a surface of the sheet to the bottom of the hole, the cross-section being parallel to the surface of the sheet.

6. The method according to claim 1, further comprising the step of:
    coating the bottom of the hole with adhesive-resistant material, before the step of filling the hole with the metallic paste,
    wherein the adhesive-resistant material prevents the metallic paste from bonding to the metallic film in the step of heating and assists in pressurizing the substrate with the sheet.

7. The method according to claim 1,
    wherein the metallic paste protrudes from a surface of the sheet in the step of filling the hole with the metallic paste.

8. The method according to claim 1, further comprising the step of:
    cutting the substrate into chips after the step of separating the sheet from the substrate having the bump,
    wherein the substrate is a semiconductor wafer.

9. The method according to claim 1,
    wherein a depth of the hole defines a height of the bump so that a plurlity of high bumps is formed uniformly, and each bump has almost the same height.

10. The method according to claim 1,
    wherein a thickness of the resin film is in the range of 10–1000 m, and thickness of the metallic film is in the range of 1–100 m.

11. The method according to claim 1,
    wherein the metallic paste is made of silver, tin, gold, copper, mixture of silver and tin, mixture of gold and tin, or mixture of copper and tin.

12. The method according to claim 1,
    wherein the step of heating and pressurizing the substrate with the sheet includes the steps of:
    heating the substrate with the sheet at 200° C. during 5 minutes;
    pressurizing the substrate with the sheet at 1–10 MPa; and
    heating the substrate with the sheet at 200–270° C. during 10–30 minutes with pressurizing at 1–10 MPa.

13. The method according to claim 1,
    wherein the hole is formed with using a laser beam machining in the step of forming the hole in the sheet, and
    wherein a carbon layer is formed on the metallic film in the step of forming the hole in the sheet with the laser beam machining so that the carbon layer works as an adhesive resistant layer for being adhesive resistant to the metallic paste.

14. The method according to claim 1,
    wherein the substrate is a semiconductor wafer or a semiconductor chip.

15. The method according to claim 1,
    wherein the sheet includes a resin film made of thermoplastic resin, a metallic film made of metallic foil, and a separation film,
    wherein the separation film is stacked on the resin film, and the resin film is stacked on the metallic film,
    wherein the separation film is adhesive-resistant to the substrate, and
    wherein the hole is formed in both the separation film and the resin film, and reaches the metallic film so that the hole has the bottom of the metallic film.

16. The method according to claim 15,
    wherein the separation film is made of poly-imide resin.

17. The method according to claim 15,
wherein the separation film is stacked on the resin film, after a surface of the separation sheet is roughly finished so that the separation film is adhesive resistant to the resin film, the surface of the separation sheet being stacked on the resin film.

18. The method according to claim 1,
wherein the hole is formed with using a carbon dioxide laser beam machining in the step of forming the hole in the sheet.

19. The method according to claim 18,
wherein the laser beam machining is performed by a carbon dioxide laser.

20. The method according to claim 1,
wherein the substrate is a printed circuit board of a single layer or multiple layers.

21. The method according to claim 20,
wherein the printed circuit board is made of thermoplastic resin as an insulating material.

22. The method according to claim 1,
wherein the sheet includes a resin film made of thermoplastic resin, a metallic film made of metallic foil, and a protection film,
wherein the protection film is stacked on the resin film, and the resin film is stacked on the metallic film, and
wherein the hole is formed in both the protection film and the resin film, and reaches the metallic film so that the hole has the bottom of the metallic film, further comprising the step of:
separating the protection film from the resin film with the metallic film, after the step of filling the hole with the metallic paste.

23. The method according to claim 22,
wherein the metallic paste protrudes from a surface of the sheet after the step of separating the protection film from the resin film with the metallic film, and
wherein the protection film is made of polyethylene terephthalate.

24. A method of bonding a first substrate and second substrate, comprising the steps of:
forming a bump on an electrode of the first substrate by using the method according to claim 1;
forming a hole in the second substrate at a position corresponding to a position of the electrode of the first substrate, the hole having a bottom;
filling the hole of the second substrate with a metallic paste;
stacking and positioning the first substrate on the second substrate so that the hole of the second substrate faces the bump of the first substrate; and
heating and pressurizing the second substrate with the first substrate sp that the metallic paste is sintered and bonded to the electrode.

25. The method according to claim 24,
wherein a top end of the bump is inserted into the hole filled with the metallic paste in the step of stacking and positioning the first substrate on the second substrate.

26. The method according to claim 24,
wherein the bump is formed into a tapered shape, a cross-section of which becomes smaller as it goes from a surface of the first substrate to a top end of the bump.

27. The method according to claim 24,
wherein the hole is formed into a tapered shape in the step of forming the hole in the second substrate, and
wherein a cross-section of the hole becomes smaller as it goes from a surface of the second substrate to the bottom of the hole, the cross-section being parallel to the surface of the second substrate.

28. The method according to claim 24,
wherein the first substrate is a semiconductor substrate, a single layer printed circuit board, or a multi-layer printed circuit board, and
wherein the second substrate is a semiconductor substrate, a single layer printed circuit board, or a multi-layer printed circuit board.

29. The method according to claim 24,
wherein the bump of the first substrate is made of the same material a the metallic paste filling the hole of the second substrate.

30. The method according to claim 24,
wherein the second substrate is used as an interposer in a chip size package.

31. The method according to claim 24,
wherein the bump is formed into a tapered shape, a cross-section of which becomes smaller as it goes from a surface of the first substrate to a top end of the bump, the cross-section being parallel to the surface of the first substrate,
wherein the hole is formed into a tapered shape in the step of forming the hole in the second substrate, and
wherein a cross-section of the hole becomes smaller as it goes from a surface of the second substrate to the bottom of the hole, the cross-section being parallel t the surface of the second substrate.

32. The method according to claim 24,
wherein the first substrate is a semiconductor wafer or a semiconductor chip, and
wherein the second substrate is a semiconductor wafer or a semiconductor chip.

33. The method according to claim 24,
wherein each of first and second substrates is a semiconductor wafer, respectively, so that the second substrate with the first substrate provides a three-dimensional integrated circuit wafer.

34. The method according to claim 33, further comprising the step of:
cutting the three-dimensional integrated circuit wafer into chips, after tie step of heating and pressurizing the second substrate with the first substrate.

* * * * *